United States Patent [19]

Tanaka

[11] Patent Number: 4,915,655
[45] Date of Patent: Apr. 10, 1990

[54] TELEPHONE CONNECTOR
[75] Inventor: Masanori Tanaka, Osaka, Japan
[73] Assignee: Hosiden Electronics Co., Ltd., Osaka, Japan
[21] Appl. No.: 338,815
[22] Filed: Apr. 17, 1989
[30] Foreign Application Priority Data Apr. 25, 1988 [JP] Japan ............................ 63-56276[U]

[51] Int. Cl.⁴ ............................................ H01R 23/02
[52] U.S. Cl. .................................... 439/676; 439/83; 439/554
[58] Field of Search ............... 439/695, 696, 701, 712, 439/752, 731, 676, 344, 554, 567

[56] References Cited

U.S. PATENT DOCUMENTS

| | | | |
|---|---|---|---|
| 4,202,593 | 5/1980 | Abernethy et al. | 439/676 |
| 4,221,458 | 9/1980 | Hughes et al. | 439/676 |
| 4,698,025 | 10/1987 | Silbernagel et al. | 439/676 |
| 4,699,595 | 10/1987 | Nakazawa et al. | 439/676 |
| 4,703,991 | 11/1987 | Phillipson | 439/676 |

*Primary Examiner*—David Pirlot
*Attorney, Agent, or Firm*—Pollock, Vande Sande and Priddy

[57] ABSTRACT

A telephone connector in which a contact holder carrying a plurality of contacts is disposed in a body which has in its front a plug receiving hole and is open at its bottom. Mounting members for mounting the body on a printed circuit board are provided on both side panels of the body. The mounting members define the plane in which the body is mounted on the printed circuit board. Lower end faces of both side panels of the body are substantially flush with this plane. After terminals of the contacts have been automatically soldered to the printed circuit board, the open bottom of the body is closed by a separately prepared cover.

8 Claims, 3 Drawing Sheets

TELEPHONE CONNECTOR

BACKGROUND OF THE INVENTION

The present invention relates to a telephone connector which is employed for connecting telephone sets.

In this kind of telephone connector the lower portion of a plug receiving hole is positioned below a terminal lead-out portion, that is, a printed circuit board. The body of a conventional telephone connector is a molding of a resin material as disclosed in Japanese Utility Model Laid-Open Application No. 25476/87 and U.S. Pat. No. 4,698,025, for example. If connector terminals fitted onto the printed circuit board are dipped into a solder bath for automatically soldering them together, the lower portion of the plug receiving hole of the body is also inevitably dipped into solder, allowing the connector body to be deformed by heat. Consequently, such a conventional telephone connector cannot employ automatic soldering. If the telephone connector is designed so that the bottom of the plug receiving hole is flush with or higher than the underside of the printed circuit board to avoid the above problem, then the overall height of the connector body will become disadvantageously large.

SUMMARY OF THE INVENTION

It is an object of the present invention to provide a telephone connector which permits automatic soldering and is small in its height from the printed circuit board.

According to the present invention, the lower portion of the plug receiving hole is formed as a cover separately of the connector body, and the cover can be attached to the connector body from below or from the front. With such a structure, connector terminals can be automatically soldered to the printed circuit board, with the cover removed, and then the cover is mounted on the body.

DESCRIPTION OF THE PREFERRED EMBODIMENTS

Figure 1:
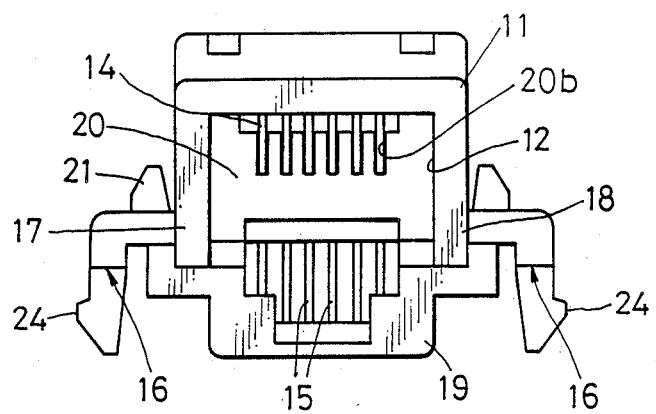
FIG. 1 is a front view illustrating a first embodiment of the present invention.
Figure 2:
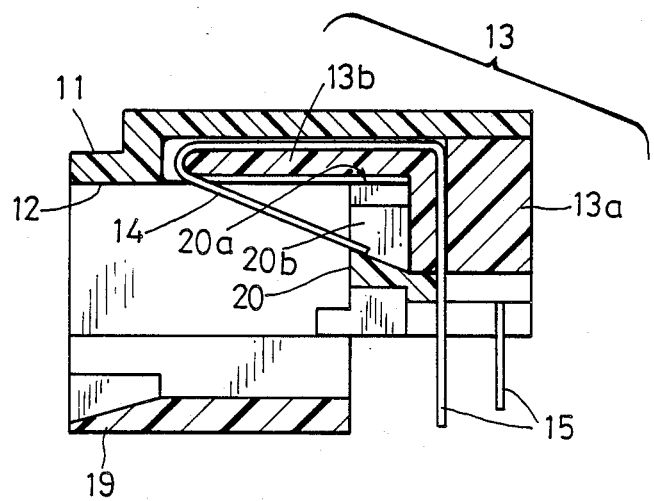
FIG. 2 is a sectional view of the embodiment depicted in FIG. 1.

FIGS. 1 and 2 illustrate a first embodiment of the present invention. A connector body 11, which is a molding of a synthetic resin material, is a substantially rectangular parallelpiped and has a square plug receiving hole 12 open to the front and the underside of the body 11. The inner end of the plug receiving hole 12 is defined by a partition wall 20, and a holder receiving hole 20a is provided between the top end face of the wall 20 and the ceiling of the inside of the body 11. The wall 20 has guide grooves 20b extending downwardly from its top end face.

A holder 13 having mounted thereon a plurality of contacts 14 is provided in the rear of the body 11. The holder 13 comprises a block portion 13a holding terminals 15 contacts at fixed intervals, the block portion 13a and the support portion 13b being formed as one body of a resin material When the holder 13 is inserted in the connector body 11 with the support portion 13b received in the holder receiving hole 20a and the block portion 13a positioned behind the partition wall 20, the contacts 14 are respectively guided into the guide grooves 20b, with their terminals 15 projecting out downwardly from the bottom of the connector body 11.

Figure 3A:
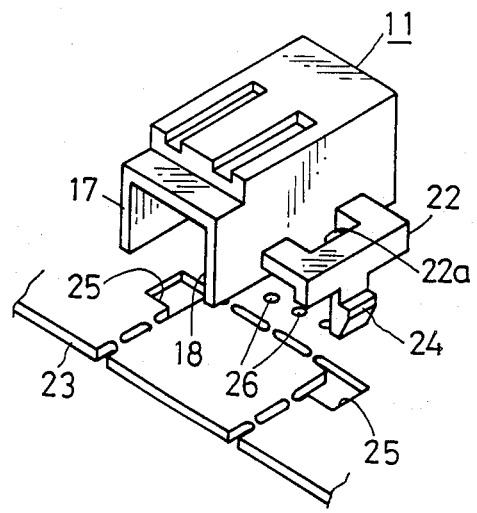
FIGS. 3A through 3D are diagrams showing a sequence of steps involved in assembling the telephone connector in accordance with the first embodiment.
Figure 3B:
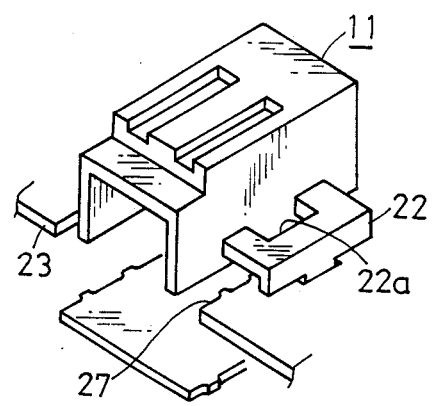

As shown in FIGS. 1 and 3A, on of each side panel of the connector body 11 there is formed integrally therewith a mounting member 22 which has a locking hole 22a and extends horizontally. The mounting member 22 has its tip end portion extended down at right angles, and the lower end face 16 of the downwardly projection portion defines the plane in which a printed circuit board is disposed. The mounting member 22 has formed integrally therewith an engaging piece 24 extending downwardly from its lower end face 16 substantially centrally thereof. The lower end faces of both side panels 17 and 18, which define the plug receiving hole 12 therebetween, are positioned substantially flush with the lower end faces 16 of the mounting members 22.

A cover 19 molded of synthetic resin is attached to the body 11 from below, forming the bottom of the plug receiving hole 12. The cover 19 is locked at its opposite sides to the exterior surfaces of both side panels 17 and 18 of the body 11. For example, the cover 19 has locking pawls 21 formed integrally therewith and extending upwardly from its opposite sides, and the pawls 21 are locked into the holes 22a of the mounting members 22, fixing the cover 19 to the body 11.

Figure 3C:
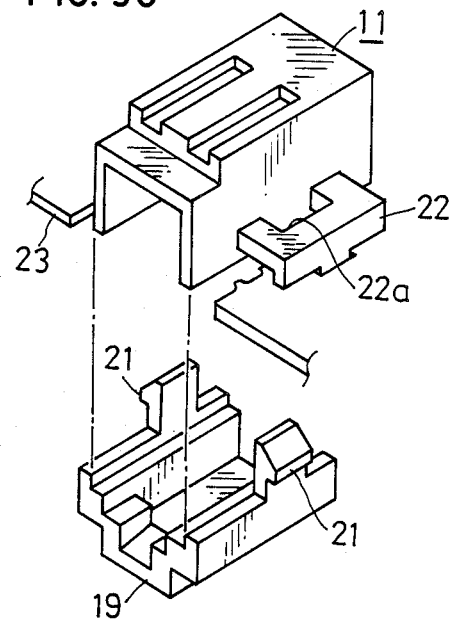
Figure 3D:
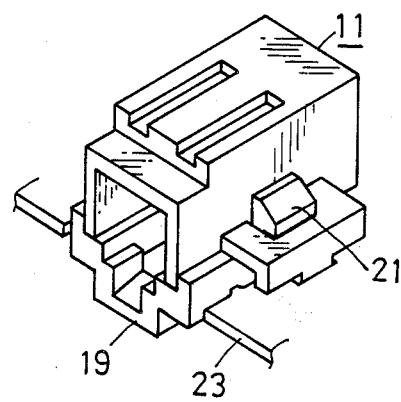

Now, a description will be given, with reference to FIGS. 3A through 3D, of a sequence of steps which are involved in soldering such a telephone connector to a printed circuit board. Prior to soldering, the engaging pieces 24 formed integrally with the mounting members 22 are inserted and locked into square holes 25 of a printed circuit board 23, with the cover 19 taken off, and the terminals 15 are inserted into small holes 26 (FIG. 3A). After soldering, a square cutaway 27 is formed in a portion of the printed circuit board 23 which is opposed to the open bottom portion of the body 11 (FIG. 3B) and the cover 19 is engaged with the body 11 from the underside of the printed circuit board 23 through the cutaway 27, that is, the locking pawls 21 are inserted and locked into the locking holes 22a (FIGS. 3C and 3D). In this instance, since the cover 19 has not been mounted during soldering step, it is possible to perform automatic soldering through use of a solder bath. Furthermore, since the cover 19 is positioned below the printed circuit board 23, the height of the telephone connector from the printed circuit board 23 can be made small.

Figure 4A:
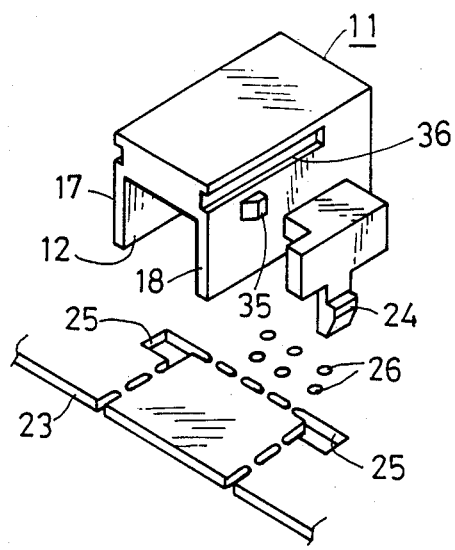
FIGS. 4A through 4D are diagrams showing a sequence of steps involved in assembling the telephone connector in accordance with a second embodiment of the present invention.
Figure 4B:
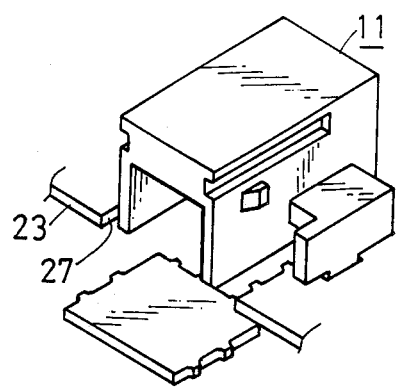
Figure 4C:
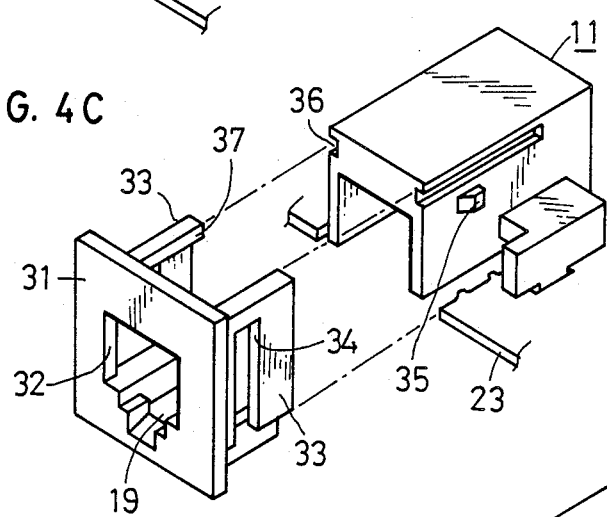
Figure 4D:
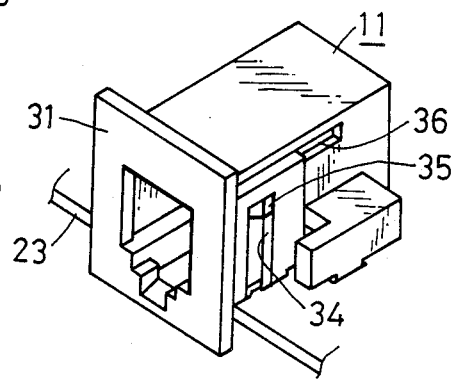

FIGS. 4A through 4D illustrate a sequence of steps involved in mounting the telephone connector onto the printed circuit board in accordance with a second embodiment of the present invention. The parts corresponding to those in FIGS. 3A through 3D are identified by the same reference numerals. In this embodiment a front panel 31 is formed as a unitary structure with the cover 19 and is abutted against the front of the body 11, the front panel 31 having a substantially square plug receiving hole 32. The cover 19 with the front panel 31 is engaged with the body 11 from the front thereof as shown in FIG. 4C. The cover 19 has a pair of guide pieces 33 planted thereon at both sides. The guide pieces 33 have ridges 37 extending from the back side of the front panel 31 toward the rear in opposing relation to each other. The ridges 37 are guided along guide grooves 36 formed in the outside surfaces of the side panels 17 and 18 of the body 11. The guide pieces 33 have engagement slots 34 formed therein, which are brought into engagement with engaging pawls 35 protrusively provided on the side panels 17 and 18 of the body 11, by which the cover 19 is locked to the body 11.

It is evident that it is also possible to employ a structure in which the cover 19 with the front panel 31 is attached to the body 11 from below as in the case of FIG. 3C.

As described above, according to the present invention, since the lower portion of the plug receiving hole of the connector body is formed by a separate cover, the body can be automatically soldered to a printed circuit board, with the cover removed, and further, the height of the body from the printed circuit board can be made small.

It will be apparent that many modifications and variations may be effected without departing from the scope of the novel concepts of the present invention.

What is claimed is:

1. A telephone connector comprising:
   a substantially rectangular parallelpipedic body having at least two side panels and a top panel but having an open front and an open bottom:
   mounting means formed integrally with said body on the outside surfaces of said side panels and defining the plane in which said body is mounted on a printed circuit board;
   a contact holder disposed in said body;
   a plurality of contacts held by said contact holder at predetermined intervals in said body, rear end portions of said contacts projecting out from a lower end face of said contact holder and extending downwardly of said plane;
   a cover for closing the open bottom of said body; and
   locking means for locking said cover to said body on the outside surface of its said side panels.

2. The telephone connector of claims 1, wherein lower end faces of said side panels of said body are substantially flush with said plane in which said body is mounted on said printed circuit board.

3. The telephone connector of claim 2, wherein said locking means is a means for locking said cover to said body from below.

4. The telephone connector of claim 2, wherein said locking means is a means for locking said cover to said body from the front thereof.

5. The telephone connector of claim 2, wherein said mounting means each include an engaging piece extending down therefrom for engagement with said printed circuit board.

6. The telephone connector of claim 3, wherein said locking means includes locking pieces extending up from both sides of said cover; and engaging holes formed in said mounting means for receiving said locking pieces.

7. The telephone connector of claim 2 or 3, wherein said cover has at its front end a square front panel which is abutted against the open front of said body and which has a plug receiving hole therein.

8. The telephone connector of claim 7, wherein said square front panel of said cover is larger than the front of said body.

* * * * *